US010346583B2

(12) United States Patent
Kamalakannan

(10) Patent No.: US 10,346,583 B2
(45) Date of Patent: Jul. 9, 2019

(54) NODE PLACEMENT PLANNING

(71) Applicant: Honeywell International Inc., Morristown, NJ (US)

(72) Inventor: Arunkumar Kamalakannan, Chennai (IN)

(73) Assignee: Honeywell International Inc., Morris Plains, NJ (US)

( * ) Notice: Subject to any disclaimer, the term of this patent is extended or adjusted under 35 U.S.C. 154(b) by 971 days.

(21) Appl. No.: 13/962,540

(22) Filed: Aug. 8, 2013

(65) Prior Publication Data

US 2015/0046140 A1 Feb. 12, 2015

(51) Int. Cl.
| G06F 17/50 | (2006.01) |
| G06F 17/10 | (2006.01) |
| G06T 17/05 | (2011.01) |
| H04W 16/18 | (2009.01) |
| G01C 15/00 | (2006.01) |

(52) U.S. Cl.
CPC ............ G06F 17/509 (2013.01); G06T 17/05 (2013.01); H04W 16/18 (2013.01); G01C 15/00 (2013.01)

(58) Field of Classification Search
CPC ........ G06F 17/509; G06T 17/05; G01C 15/00
USPC .................................................. 703/1, 2, 13
See application file for complete search history.

(56) References Cited

U.S. PATENT DOCUMENTS

| 8,335,879 B2* | 12/2012 | Wilson ................... G06F 13/409 710/104 |
| 8,825,744 B2* | 9/2014 | Wang ................ G06F 17/30268 709/203 |
| 2003/0097188 A1* | 5/2003 | O'Mahoney ......... G05B 19/042 700/17 |
| 2004/0122628 A1 | 6/2004 | Laurie |
| 2005/0182736 A1* | 8/2005 | Castellanos ........... G06F 17/271 705/80 |
| 2007/0054670 A1* | 3/2007 | Kalika ................ H04L 12/2456 455/446 |
| 2010/0169032 A1* | 7/2010 | Zalyubovskiy ........ G01R 21/01 702/61 |
| 2012/0169491 A1* | 7/2012 | Chang ................. H04W 40/246 340/531 |
| 2012/0278030 A1* | 11/2012 | Fu ........................ G11B 33/128 702/150 |

FOREIGN PATENT DOCUMENTS

WO        2004086783      10/2004

OTHER PUBLICATIONS

Ahlberg et al. (Router Placement in Wireless Sensor Networks, 2006 (10 pages)).*

(Continued)

*Primary Examiner* — Andre Pierre Louis
(74) *Attorney, Agent, or Firm* — Seager, Tufte & Wickhem LLP

(57) ABSTRACT

Methods, systems, and computer-readable and executable instructions are described herein. One method includes identifying a number of structural rules of an area utilizing a map of the area, determining a placement for each node of a number of nodes of a node network on the map of the area utilizing a node placement model, identifying a placement of a node among the number of nodes that deviates from a structural rule among the number of the structural rules, and providing an indication of the node on the map of the area.

20 Claims, 5 Drawing Sheets

(56) References Cited

OTHER PUBLICATIONS

Li et al. (Sensor Coverage in Wireless Sensor Networks, 2008 (30 pages)).*
EP Search Report related to EP Application 14178627.7 dated Jan. 21, 2015 (3 pages).
Ahlberg, et al. "Router Placement in Wireless Sensor Networks", KTH/ICT/ECS Technical Report, Royal Institute of Technology, Stockholm, Sweden, 2006, 10 pages.
Examination Report from related Australia Patent Application No. 2014208289, dated Jun. 29, 2017, 3 pages.
Examination Report from related EP Application 14178627.7 dated Jan. 16, 2017, 5 pages.
Communication Pursuant to Article 94(3) EPC from related European Patent Application No. 14178627, dated Mar. 2, 2018, 4 pages.

* cited by examiner

NODE PLACEMENT PLANNING

TECHNICAL FIELD

The present disclosure relates to methods, systems, and computer-readable and executable instructions for node placement planning.

BACKGROUND

Nodes can be placed at various places in an area (e.g., room of a building, area of a compound and/or facility, floor of a building, area, etc.) to form a network, which can distribute data and/or collect data. A node can include a radio frequency (RF) device, a sensor, a wireless router, and/or a camera, for example. During installation of nodes, a site survey team can design a network topology for the placement of the nodes. The design can be provided to a contractor, who can install the nodes according to the design. In some instances, it can be difficult to install the nodes according to the design. For example, the contractor may be unable to physically place the nodes according to the design due to structural elements of the area. As an example, a particular node may not be able to be fixed to some structural elements such as a pipe or a tank.

If a node cannot be placed according to the design, the contractor may move the nodes in a trial and error method until the nodes can be physically placed at a location of the area and/or until a requirement for the network has been met with the new location. However, the trial and error method may result in reduced effectiveness of the network of nodes, increased manual effort to plan a node network, re-planning of the network topology design to provide proper coverage, and/or may be time consuming.

For instance, one or more nodes may be replaced in an incorrect position, resulting in the network of nodes not functioning as anticipated. When the network of nodes does not function as anticipated, distribution and/or collection of data by the network of nodes can be affected. For instance, an incorrectly placed wireless router can result in a location of the area not receiving a wireless signal and/or the location of the area receiving a degraded wireless signal. Alternatively, and/or in addition, data and/or images may not be collected from the area if a sensor and/or camera is placed in an incorrect location.

DETAILED DESCRIPTION

Figure 1:
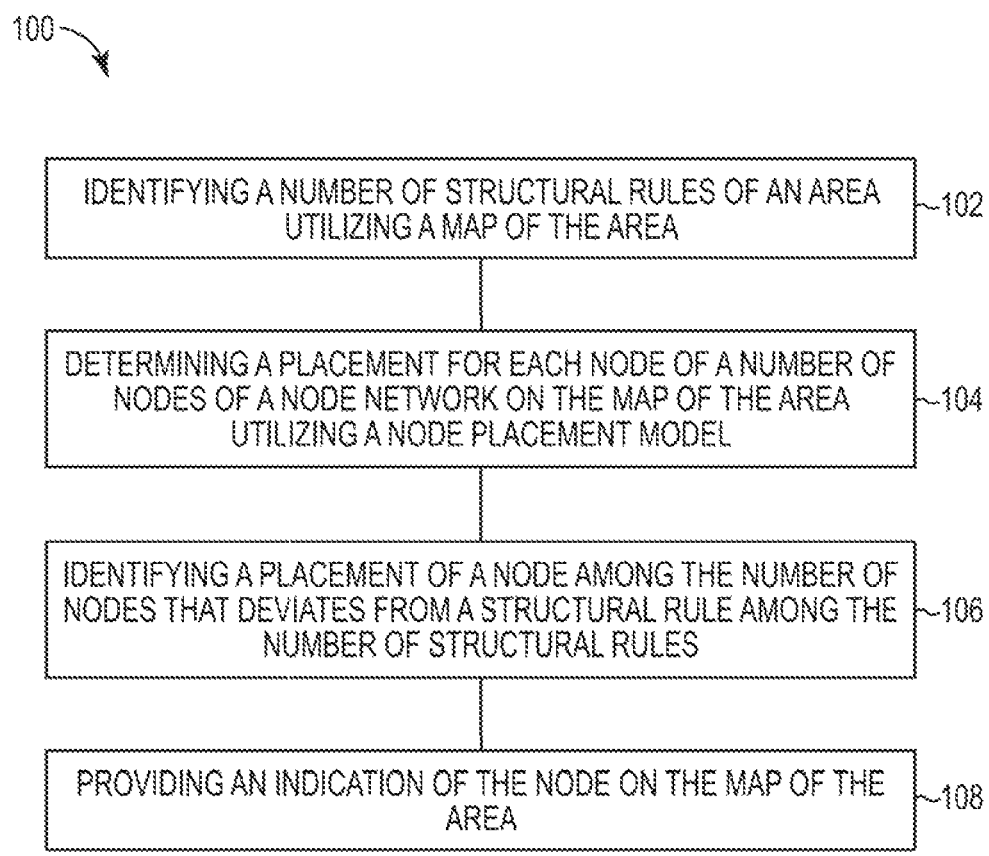
FIG. 1 illustrates an example of a method for node placement planning in accordance with one or more embodiments of the present disclosure.

Methods, systems, and computer-readable and executable instructions for node placement planning are described herein. For example, one or more embodiments can include identifying a number of structural rules for an area utilizing a map of the area, determining a placement for each node of a number of nodes of a node network on the map of the area utilizing a node placement model, identifying a placement of a node among the number of nodes that deviates from a structural rule among the number of structural rules, and providing an indication of the node on the map of the area.

As discussed herein, nodes can be placed at various places in an area to distribute data and/or collect data. For example, a wireless router can be placed in the area to distribute and/or collect data; a sensor (e.g., smoke detector) can be placed in the area to collect data (e.g., data associated with a fire), and/or a camera can be placed in the area to collect images for use in security monitoring. Placement of the nodes can be important for proper distribution and/or collection of data. In an example, an improper placement of a node can result in data not being distributed and/or collected for a portion of the area.

For instance, if a first node is placed too far from a second node, data may not be collected and/or distributed at a point that is between the first node and the second node. Alternatively, and/or in addition, if a node is placed on a first side of a wall, instead of a second side of the wall, data may not be collected and/or distributed for areas that are located on a same side as the second side of the wall.

The nodes can be installed in particular positions according to a network topology designed by a site survey team. The network topology can include a defined layout of a network of nodes, for example. The defined layout of the network of nodes can be a design that specifies where each node should be installed so that data can be properly distributed and/or collected by each node. In an example, the defined layout of the network of nodes can be designed by a survey team. The design can then be used by a contractor, who can install the nodes according to the design.

However, in some instances, the contractor may be unable to install one or more of the nodes according to the design due to structural elements of the area (e.g., the site). For instance, particular types of nodes may be unable and/or difficult to be physically placed on particular structural elements (e.g., pipes, walls, etc.). The contractor may place the nodes at a nearby position, which can result in a node that is placed in an incorrect position. As such, a performance of the incorrectly installed node may not match an anticipated performance of the designed network topology. In other instances, the contractor may notify the survey team to redesign the layout of the network of nodes resulting in increased time and cost to implement a node placement plan.

In contrast, embodiments of the present disclosure include node placement planning methods, systems, and computer-readable and executable instructions that improve installation efficiency and reduce manual action as compared to previous approaches. Node placement planning, in accordance with one or more embodiments, can include importing a map of an area (e.g., the, site) and identifying structural information from the imported map. The structural information can include structural elements of the area (e.g., walls, pipes, ducts, etc.). The structural information can be used, in various embodiments, to identify a number of structural rules of the area that can be input into a node placement model (e.g., a function to determine placement of a number of nodes at an area).

For instance, structural rules can include computer-executable instructions and/or logic that results in identification of a node that can be placed according to a node placement plan and/or a node that cannot be placed according to the node placement plan due to a structural element of the area (e.g., the node overlaps with a structural element resulting in what may be a physically impossible and/or difficult placement). A structural rule can, for instance, result in a set of actions to perform in response to the outcome. In some instances, the structural rules can each have a conventional two-part form: an if-part defining a condition and a then-part defining a conclusion or action that is asserted if the condition is satisfied.

For instance, a node that cannot be placed according to the node placement plan can have an indication provided that highlights the node on the map of the area during the process of designing the node placement plan according to a node placement model. A user can revise the location of the highlighted node on the map and re-run the node placement model to ensure the node placement plan complies with the structural rules and the resulting network of nodes will properly function.

These embodiments are described in sufficient detail to enable those of ordinary skill in the art to practice one or more embodiments of this disclosure. It is to be understood that other embodiments may be utilized and that process, electrical, and/or structural changes may be made without departing from the scope of the present disclosure.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure, and should not be taken in a limiting sense.

The figures herein follow a numbering convention in which the first digit or digits correspond to the drawing figure number and the remaining digits identify an element or component in the drawing. Similar elements or components between different figures may be identified by the use of similar digits.

As used herein, "a" or "a number of" refers to one or more. For example, "a number of nodes" can refer to one or more nodes. Additionally, the designator "P", "Q", and "N" as used herein, particularly with respect to reference numerals in the drawings, indicate that a number of the particular features so designed can be included with a number of embodiments of the present disclosure.

FIG. 1 illustrates an example of a method for node placement planning in accordance with one or more embodiments of the present disclosure. The method 100 can be used to identify nodes placed on a map of an area during node placement planning that may be placed on a structural element that the nodes cannot physically be placed on and/or it may be difficult to place the node on. The identification of the potentially problematic node placement can occur and be resolved during node placement planning.

At block 102, the method 100 can include identifying a number of structural rules of an area utilizing a map of the area. The area can include a particular site, an indoor area (e.g., a home, a building, tunnel system), and/or an outdoor area (e.g., a facility, multiple building complex, etc.), among other areas. The map can include a map in an object readable format (e.g., a computer-aided design (CAD) file, a Building Information Model (BIM) format), a map in a raster format (e.g., image/Joint Photographic Experts Group (JPEG) format), and/or a map in three-dimensions (e.g., as discussed further with regards to FIG. 4), among other formats.

The structural rules can be identified, for instance, using structural information of the area. The structural information can include structural elements and the physical placement (e.g., a location) of the structural elements in the area. Structural elements can include objects and/or material. The structural information, in various examples, can be identified utilizing the map of the area.

A number of techniques can be used to identify the structural information based on the format of the map of the area. For instance, if the map includes an object readable format, the structural information can be identified by extracting the structural information from the object readable format. If the map includes a raster format, the structural information can be identified by utilizing an automatic tagging model (e.g., a function) to generate structural information by identifying the structural elements in the map based on pattern matching (e.g., as discussed further herein).

Based on the structural information, the structural rules can be identified. The structural rules can be used to identify a sub-set of nodes that cannot be physically placed on and/or may be difficult to be physically placed on a number of structural elements of the area. Alternatively and/or in addition, the structural rules can be used to identify a sub-set of nodes that can be physically placed on a number of structural elements of the area. That is, one or more types of nodes may be unable to be installed (e.g., physically placed) on structural elements of the area and one or more types of nodes may be able to be installed on at least some types of structural elements of the area.

At block 104, the method 100 can include determining a placement for each node of a number of nodes of a node network on the map of the area utilizing a node placement model. The node placement model can include a digital representation of a function (e.g., an algorithm) that can be used to define a layout of the network of nodes, for example. The defined layout of the network of nodes can be a design that specifies where each node should be installed so that data can be properly distributed and/or collected by each node. The node placement model can be used to place the network of nodes on the map of the area to provide sufficient coverage (e.g., such as radio frequency (RF) coverage).

For instance, the nodes can be costly devices and so only a minimum number of these devices should be deployed in the area (e.g., a plant, a facility, a building). To solve this problem, the node placement model can compute the minimum number of nodes required to provide coverage in the desired area of interest and at the same time enable mesh connectivity among the nodes. Along with computing the minimum number of the nodes required, the node placement model can determine the location where these nodes can be placed to provide sufficient coverage.

As an example, industrial plants can have mobile wireless nodes that can roam throughout the area of the plant and need wireless connectivity irrespective of their position. These wireless nodes can require that they communicate with a central server in the plant. In such situations, there can be a need for deploying a number of nodes so that the whole plant area, which may have an irregular shape, is in the wireless coverage range of these nodes and also the nodes should be able to form a mesh network to relay the information from the mobile wireless nodes to the central server.

The node placement model, in various embodiments, can include a Minimum Node Connected Coverage (MNCC) algorithm, which can provide for coverage of the area and connectivity by providing one path between any pair of nodes. Alternatively, and/or in addition, some embodiments provide a Robust Connected Coverage (RCC) algorithm, which can provide coverage for the area and one path between any pair of nodes. In an example, the RCC algorithm can achieve redundancy of more than one path between any pair of nodes and can achieve redundancy in coverage.

At block 106, the method 100 can include identifying a placement of a node among the number of nodes that deviates from a structural rule among the number of structural rules. Deviating from a structural rule can include, for instance, placement of a node that overlaps with a structural element that the node cannot and/or is difficult to be physically placed on during installation. In contrast, a node that complies with a structural rule can include placement of a node that does not overlap with a structural element and/or that overlaps with a structural element that the node can physically be placed on during installation. In various embodiments, more than one node may be identified as deviating from one or more structural rules.

The identification of a node that deviates from a structural rule, in some embodiments, can be based on the node placement model. For instance, the one or more structural rules can be input into the node placement model. Using the node placement model, the placement of the nodes of the node network can be verified for compliance with the one or more input structural rules.

At block 108, the method 100 can include providing an indication of the node (e.g., the identified node) on the map of the area. The indication can include, for instance, a visual indication provided on the map of the area. Example indications can include a color indication that highlights the node on the map (e.g., a grey-scale, red, etc.) and/or a line surrounding the node on the map.

In some embodiments, a different indication can be provided for a node that is overlapping with a structural element of the area and complies with the number of structural rules. The different indication can include a visual indication such as a different color (e.g., green, a lighter and/or darker grey than the color indication of the identified deviating node).

Figure 2:
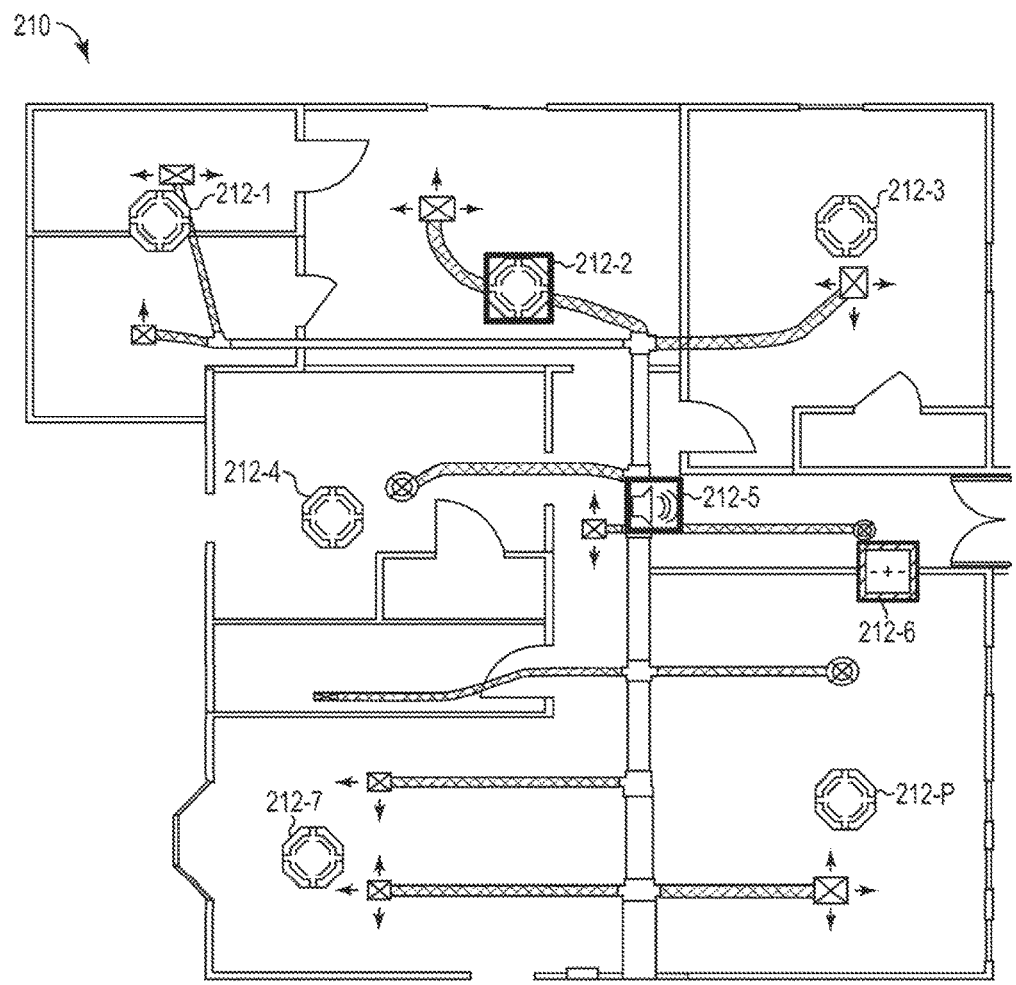
FIG. 2 illustrates an example of a map of an area in accordance with one or more embodiments of the present disclosure.

FIG. 2 illustrates an example of a map 210 of an area in accordance with one or more embodiments of the present disclosure. The area can include an indoor area, such as a home and/or other building.

The area, as illustrated in the embodiment of FIG. 2, can include multiple sub-portions. A sub-portion can include a room that may have structural elements that separate the sub-portion from other sub-portions of the area. Example sub-portions can include rooms (e.g., bedrooms, closets, bathrooms). Although the present embodiment illustrates an indoor area as a single floor home, embodiments in accordance with the present disclosure are not so limited. Indoor areas in accordance with some embodiments of the present disclosure can include multiple floors, an industrial factory, and/or an office building, among other indoor areas.

The map 210 of the area can be imported to a computing system to develop a node placement plan. The map 210 of the area, as illustrated in FIG. 2, can be calibrated with coordinates. Calibrating the map 210 with coordinates can include adding real world coordinates to give the map dimensions and locations. Dimensions and locations can include two-dimensional (2D) and/or three-dimensional (3D) coordinates (e.g., measurements) of sub-portions of the area, elements, and/or objects associated with the area. Example dimensions can include the Master Bedroom measuring 17 feet by 15 feet six inches.

As illustrated by the embodiment of FIG. 2, the map 210 of the area can include structural information. The structural information can include identification and placement of structural elements in the area. The structural information, in some instances, may be extracted from the imported map 210. Alternatively and/or in addition, structural information can be determined using the map 210 and an automatic tagging model (e.g., as discussed further herein).

The structural information can be utilized, for instance, to identify one or more structural rules of the area. Each structural rule can be associated, for instance, with a type of node and a type of structural elements. For example, a type of node can include a classification of a node (e.g., a router) and a type of structural element can include a classification of structure (e.g., a wall, a metal pipe, and duct). Particular types of nodes may be unable to be physically placed on particular types of structural elements (e.g., cannot be physically installed on and/or it is difficult to be physically installed on). In contrast, particular types of nodes may be able to be physically placed on particular types of structural elements.

For example, it may be difficult to physically place nodes such as a detector device and a sounder device on walls, ducts (e.g., air conditioning duct), and/or metal objects, among other structural elements. A camera device and/or manual call point (MCP) device, in contrast, may be able to be physically placed on a wall but it may be difficult to place the devices on a metal object, such as a tank and/or pipe, among other structural elements.

In various instances, the structural rules can include the location (e.g., coordinates) of the structural elements in the area, identification of the type of structural element at each location, identification of types of nodes that cannot be physically placed on particular types of structural elements, and/or identification of types of nodes that can be placed on particular types of structural elements. The one or more structural rules can be input, for instance, into a node placement model.

A node placement model can be utilized to determine a placement for each node of a number of nodes 212-1, 212-2, 212-3, 212-4, 212-5, 212-6, 212-7 . . . 212-P (herein generally referred to as "the number of nodes 212") of a node network on the map 210 of the area. The determined placement of the number of nodes 212 can be displayed on the map 210, as illustrated by FIG. 2.

The node placement model can be used to provide sufficient coverage to the area with an increased efficiency. For instance, a theoretical lower limit of the smallest number of nodes utilized to provide connectivity and coverage to the area can be calculated. In an example, the efficiency of the MNCC and RCC algorithm can be calculated by dividing the theoretical lower limit of the smallest number of nodes required to provide connectivity and coverage to the area by the number of nodes calculated by the MNCC and RCC algorithm. In an example, the MNCC algorithm can provide coverage and connectivity to the area of interest with an efficiency of 0.86 and the RCC algorithm can provide coverage and connectivity to the area of interest with an efficiency of 0.71.

In accordance with embodiments of the present disclosure, the node placement model with input one or more structural rules can be used to identify placement of one or more nodes that deviates from one or more structural rules. That is, the node placement model with input structural rules can be utilized to verify compliance of the plan with the structural rules during design planning of the node placements.

In response to identifying one or more nodes deviate from (e.g., does not comply) one or more structural rules, an indication of the node can be provided on the map 210. For instance, the indication can include a first visual indication (e.g., first color indication and/or other visual indication to highlight the node on the map.) In some embodiments, a second indication, such as a second visual indication, can be provided of a node on the map 210 that is located on the structural element of the area and complies with the number of structural rules.

As an example, node 212-2 can include a detector device (herein referred to as "detector node 212-2"), node 212-5 can include a sounder device (e.g., an alarm/noise making device) (herein referred to as "sounder node 212-5"), and node 212-6 can include a MCP device (herein referred to as "MCP node 212-6"). The structural rules may identify that nodes of a type that includes a detector and/or a sounder cannot be physically placed on particular types of structural elements, such as walls, duct work, etc. Further, the structural rules may identify that nodes of a type that includes an MCP device can be physically placed on particular types of structural elements, such as walls, but cannot be placed on other types of structural elements such as metal and/or duct work.

By inputting the structural rules into the node placement model, in addition to structural information (e.g., coordinates of the locations of the structural elements and identification of types of structural elements), nodes that deviate from a structural rule can be identified. The structural information can be input, for instance, into the structural rules and/or the node placement model, in various instances.

Nodes that deviate from a structural rule can be indicated on the map 210, such as with a visual indication. The visual indication can include a first visual color indication that highlights the nodes. For instance, using the above provided example, detector node 212-2 and sounder node 212-5 can be highlighted in a first color. The first color can include a particular color (e.g., red) and/or grey-scale shadow (e.g., a grey shadow surrounding the node). As illustrated by detector node 212-2 and sounder node 212-5 in FIG. 2, the visual indication can include a line surrounding the nodes (e.g., as illustrated by the thick black line surrounding detector node 212-2 and sounder node 212-5).

A node that complies with the one or more structural rules can be indicated on the map 210, such as with a visual indication, in some embodiments. The visual indication can include a second visual indication (e.g., such as a second visual color indication). For instance, using the above provided example, the MCP node 212-6 can be highlighted in a second color. The second color, in some instances, can include a particular color (e.g., green) and/or a grey-scale color. Alternatively and/or in addition, the second indication can include a line with dashed lines surrounding the nodes (e.g., as illustrated by the black line with dashed lines surrounding the MCP node 212-6).

The indication of the identified node (e.g., a node identified as deviating from a structure rule) can be used to bring the node and the potential installation problem to a user's attention during designing of a node placement plan. The user can revise the position (e.g. location of installation in the area) of the node. For instance, in response to an input from the user, the position of the node on the map 210 can be revised. The input can include the user selecting a new position. In some embodiments, in response to a revised position, the node placement model can be utilized to verify the revised position complies with the one or more structural rules (e.g., as discussed further herein).

Figure 3:
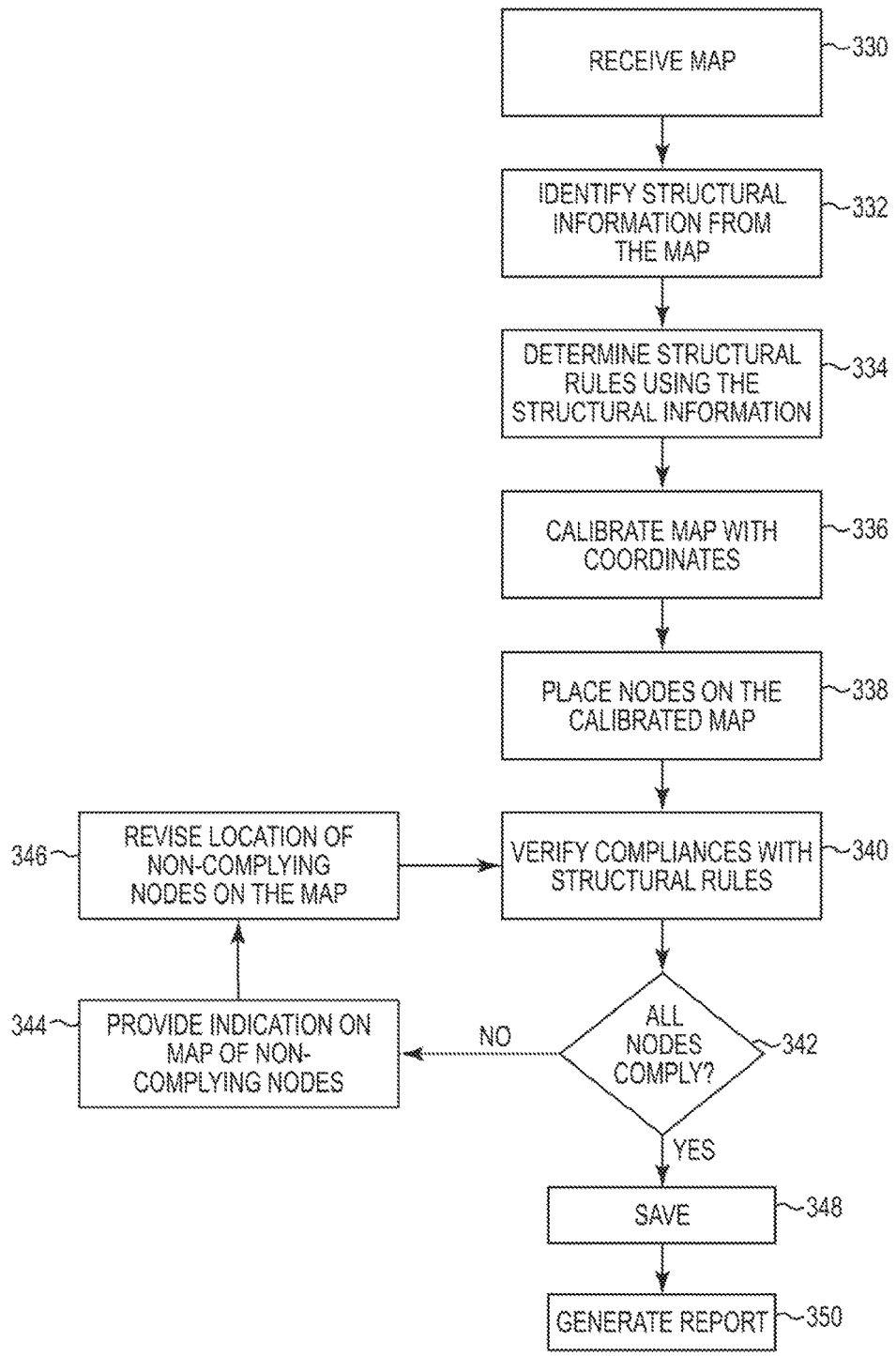
FIG. 3 illustrates a flow diagram of an example of a process for node placement planning in accordance with one or more embodiments of the present disclosure.

FIG. 3 illustrates a flow diagram of an example of a process for node placement planning in accordance with one or more embodiments of the present disclosure. The process can be utilized to design a node placement plan. The node placement plan can avoid a number of installation issues by verifying nodes are not placed on inappropriate structural elements of an area. The verification can occur during the design process, thereby, preventing re-design and/or inaccurate placement during installation.

At block 330, a map of an area can be received. In various instances, the map can be imported from a source to a computing system. The computing system can include hardware and/or software components operable to design a node placement plan.

At block 332, structural information can be identified from the received map. The identification can depend, for instance, on the format of the received map. For example, a map in an object readable format can be used to identify the structural information by extracting the structural information from the map.

Alternatively, a map in a raster format (e.g., image and/or JPEG format) can be used to generate structural information utilizing an automatic tagging model (e.g., a function) that can identify structural elements based on pattern matching. An automatic tagging model can identify structural elements in the map using pattern recognition and can classify the structural elements into various known classes based on a prior set of collected data (e.g., can identify the type of structural element). Once similar structural elements are identified in the map, they can be associated to a class of materials. Alternatively and/or in addition, a tagging rule can be applied to the map to identify the structural elements.

Furthermore, once the automatic tagging model is trained, the tagged structural elements can be directly identified without user intervention. The user can train the automatic tagging model by giving the shape and/or color of the structural element as a class. The model can also use a previously trained set of sequences, such as can be found in an Internet-based map (e.g., Google maps).

In some embodiments, the automatic tagging model can be used with an object readable format map (e.g., CAD and/or BIM format). The object readable format can be used to identify structural information without using the automatic tagging model by extracting the information. However, in some instances, the automatic tagging model can be used in addition to the extracted information.

At block 334, one or more structural rules can be determined using the structural information. The structural information can based on, for instance, identification of types of structural elements present, placement of the structural elements, and/or types of nodes that cannot be placed on and/or it is difficult to be placed on the particular types of structural elements. In some instances, a user can assist in identifying the one or more structural rules by inputting the types of nodes that cannot be placed on the particular types of structural elements.

Alternatively and/or in addition, the input by the user can occur prior to identifying the structural information. In such an instance, the input can include a pre-defined identification and/or may include a variety of types of structural elements and types of nodes that may and/or may not be utilized in the node placement plan.

At block 336, the map can be calibrated with coordinates. The coordinates can be associated with portions of the area, sub-portions of the area, and/or structural elements of the area. At block 338, a number of nodes can be placed on the calibrated map utilizing a node placement model (e.g., function).

At block 340, utilizing the node placement model, the placement of nodes can be verified for compliance with the one or more structural rules. Compliance with the structural rules can include determining the nodes can be physically placed where they are placed on the calibrated map (e.g., verify that the nodes can be installed properly at the placement).

A determination can be made, at block 342, whether all nodes of the node network (e.g., the number of nodes) comply with the structural rules. At block 344, in response to determining that not all of the nodes comply, an indication can be provided on the map of non-complying nodes (e.g., one or more nodes that deviate from one or more structural rules).

The position of the non-comply nodes on the map can, at block 346, be revised. The revision can be in response to an input by a user, for instance. Further, at block 340, the position of the number of nodes, including the revised non-complying nodes, can be verified for compliance with structural rules.

In response to determining that all nodes of the node network comply with the structural rules, at block 348, the placement of the number of nodes of the node network can be saved. In various embodiments, at block 350, a report can be generated. The report can include identification of the placement of the number of nodes at the area. The generated report can be, for instance, printed and provided to a user.

Figure 4:
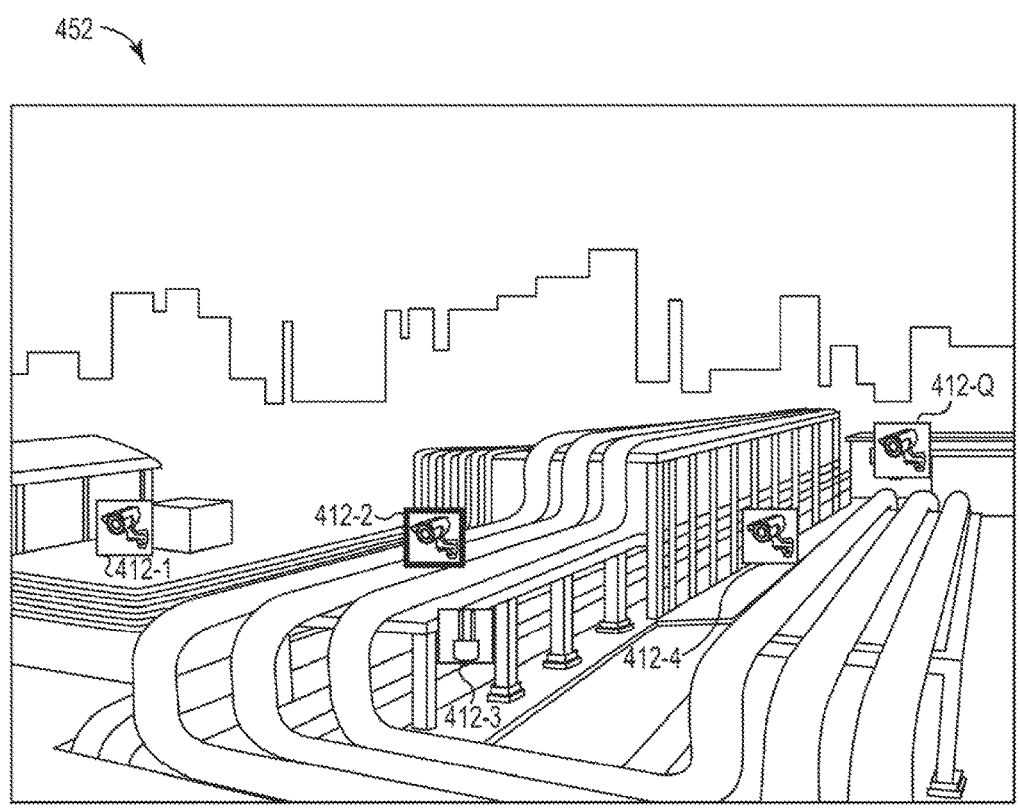
FIG. 4 illustrates an example of a map of an area in accordance with one or more embodiments of the present disclosure.

FIG. 4 illustrates an example of a map 452 of an area in accordance with one or more embodiments of the present disclosure. The area, as illustrated in FIG. 4, can include an outdoor area (e.g., an industrial plant). An outdoor area can include an industrial plant, multiple buildings, and/or a park, among other outdoor areas.

The height, altitude, and/or depth of a node can be important in some context. For instance, a MCP device or a card reader may need to be reached by a human user. Further, a camera device may need to capture an image of an object and/or location of the area at a particular height. In such instances, the map 452 can include a 3D map. That is, the map 452 can include an x-axis, a y-axis, and a z-axis (e.g., for depth). In such an instance, a calibrated map can include coordinates added to the map 452 that include the x-axis values, y-axis values, and z-axis values. Further, as discussed below, a node placement model can consider z-axis values when placing nodes on the map 452 and/or with structural elements.

The map 452 illustrated by the embodiment of FIG. 4 represents a 3D view of a node system on the area of an industrial plant such as a refinery. The map 452 can include many structural elements such as pipes, columns, stacks, buildings, and stairs. Nodes 412-1, 412-2, 412-3, 412-4 . . . 412-Q (herein generally referred to as "the number of nodes 412") can be placed on the map 452 during node placement planning and are either installed and/or planned to be installed at the area.

During node placement planning, the structural elements can be identified using the map 452 and can be used to identify one or more structural rules of the area. The one or more structural rules of the area can include 3D coordinates (e.g., x-axis, y-axis, and z-axis values) for each structural element. The structural rules can be input into the node placement model.

Using the node placement model, the number of nodes 412 can be placed on the map 452 and the placement of the number of nodes 412 can be verified for compliance with the number of structural rules. The placement and verification can include compliance with 3D coordinates. For example, a particular node may deviate from one or more rules by overlapping with the 3D coordinates of a structural element that the particular node cannot physically be placed on. Thereby, the determined placement of the number of nodes 412 (e.g., determined using the node placement model) can include 3D coordinates.

A node that deviates from one or more structural rules can be indicated on the map 452. The indication, as illustrated on FIG. 4, can include a visual indication (e.g., the line surrounding the node 412-2, a particular color, a grey-scale shadow, etc.) For example, node 412-2 can include a camera device (herein referred to as "camera node 412-2"). Camera node 412-2 is placed on a structural element (e.g., a pipe/a pipe line) that may be problematic to physically place (e.g., install) the camera node 412-2 on. The determination that the camera node 412-2 cannot be placed on the structural element includes consideration of the z-axis value of the camera node 412-2 and the overlapping structural element on the map 452 utilizing the node placement model (e.g., function), for example.

A user may move the placement of the camera node 412-2 on the map 452 and the node placement model may be re-run to determine compliance of the node network, including the revised placement of the camera node 412-2, with the structural rules and/or to determine sufficient coverage of the area (e.g., such as sufficient RF coverage).

The re-run node placement model can include a verification process. For instance, using the node placement model, the placement of the number of nodes can be verified for compliance with the number of structural rules. The verification can utilize z-axis coordinates (e.g., z-axis values) of the placement of the number of nodes and the z-axis coordinates of the number of structural elements from the identified structural information to verify compliance with the number of structural rules and/or to verify sufficient node coverage of the area, such as sufficient RF coverage.

Figure 5:
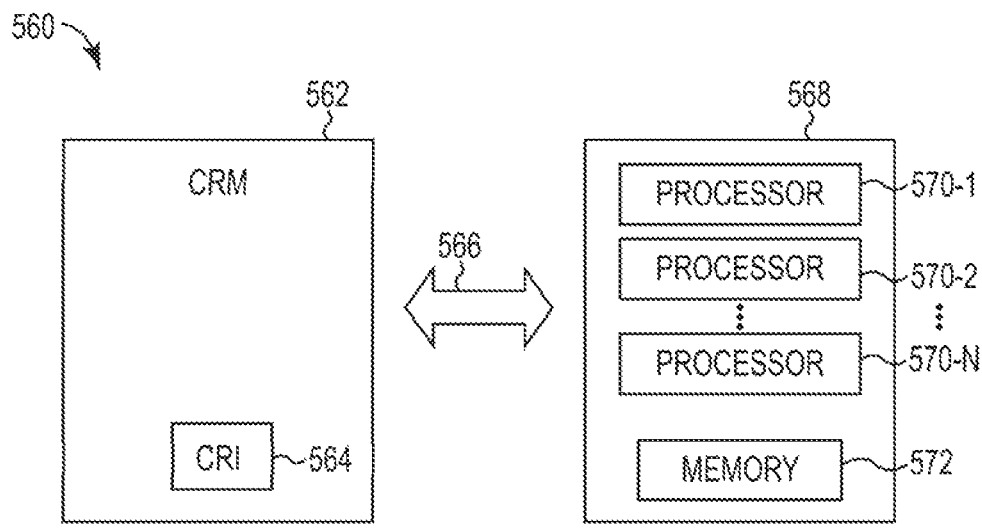
FIG. 5 illustrates a block diagram of an example of a system in accordance with one or more embodiments of the present disclosure.

FIG. 5 illustrates a block diagram of an example of a system 560 in accordance with one or more embodiments of the present disclosure. As shown in the embodiment of FIG. 5, the system 560 includes a computer-readable medium (CRM) 562 in communication with processing resources 570-1, 570-2 . . . 570-N.

CRM 562 can be in communication with a device 568 (e.g., a Java® application server, a mobile device, among others) having processing resources 570-1, 570-2 . . . 570-N. The device 568 can be in communication with a tangible non-transitory CRM 562 storing a set of computer-readable instructions (CRI) 564 executable by one or more of the processing resources 570-1, 570-2 . . . 570-N, as described herein. The CRI 564 can also be stored in remote memory managed by a server and represent an installation package that can be downloaded, installed, and executed. The device 568 can include the memory resource 572, and the processing resources 570-1, 570-2 . . . 570-N can be coupled to the memory resource 572.

Processing resources 570-1, 570-2 . . . 570-N can execute CRI 564 that can be stored on an internal or external non-transitory CRM 562. The processing resources 570-1, 570-2 . . . 570-N can execute CRI 564 to perform various functions. For example, the processing resources 570-1, 570-2 . . . 570-N can execute CRI 564 to identify structural information of an area from an imported map of the area.

A non-transitory CRM (e.g., CRM 562), as used herein, can include volatile and/or non-volatile memory. Volatile memory can include memory that depends upon power to store information, such as various types of dynamic random access memory (DRAM), among others. Non-volatile memory can include memory that does not depend upon power to store information. Examples of non-volatile memory can include solid state media such as flash memory, electrically erasable programmable read-only memory (EEPROM), phase change random access memory (PCRAM), magnetic memory such as a hard disk, tape drives, floppy disk, and/or tape memory, optical discs, digital versatile discs (DVD), Blu-ray discs (BD), compact discs (CD), and/or a solid state drive (SSD), etc., as well as other types of computer-readable media.

The non-transitory CRM 562 can also include distributed storage media. For example, the CRM 562 can be distributed among various locations.

The non-transitory CRM 562 can be integral, or communicatively coupled, to a computing device, in a wired and/or a wireless manner. For example, the non-transitory CRM 562 can be an internal memory, a portable memory, a portable disk, or a memory associated with another computing resource (e.g., enabling CRTs to be transferred and/or executed across a network such as the Internet).

The CRM 562 can be in communication with the processing resources 570-1, 570-2 . . . 570-N via a communication path 566. The communication path 566 can be local or remote to a machine (e.g., a computer) associated with the processing resources 570-1, 570-2 . . . 570-N. Examples of a local communication path 566 can include an electronic bus internal to a machine (e.g., a computer) where the CRM 562 is one of volatile, non-volatile, fixed, and/or removable storage medium in communication with the processing resources 570-1, 570-2 . . . 570-N via the electronic bus. Examples of such electronic buses can include Industry Standard Architecture (ISA), Peripheral Component Interconnect (PCI), Advanced Technology Attachment (ATA), Small Computer System Interface (SCSI), Universal Serial Bus (USB), among other types of electronic buses and variants thereof.

The communication path 566 can be such that the CRM 562 is remote from the processing resources e.g., 570-1, 570-2 . . . 570-N such as in a network relationship between the CRM 562 and the processing resources (e.g., 570-1, 570-2 . . . 570-N). That is, the communication path 566 can be a network relationship. Examples of such a network relationship can include a local area network (LAN), wide area network (WAN), personal area network (PAN), and the Internet, among others. In such examples, the CRM 562 can be associated with a first computing device and the processing resources 570-1, 570-2 . . . 570-N can be associated with a second computing device (e.g., a Java server, a mobile device, etc.). For example, a processing resource 570-1, 570-2 . . . 570-N can be in communication with a CRM 562, wherein the CRM 562 includes a set of instructions and wherein the processing resource 570-1, 570-2 . . . 570-N is designed to carry out the set of instructions to perform node placement planning.

Processing resources 570-1, 570-2 . . . 570-N coupled to the memory resource 572 can identify structural information of an area from an imported map of the area. The structural information can be identified, for instance, by extracting the information from the file of the map and/or by performing automatic tagging.

For instance, the processing resources 570-1, 570-2 . . . 570-N coupled to the memory resource 572 can input a number of structural rules of the area into a node placement model utilizing the identified structural information. In various embodiments, the number of structural rules can be determined, for instance, based on the structural information and/or identification of types of nodes that cannot be placed on types of structural elements. The identification of types of nodes that cannot be placed on types of structural elements can be input by a user during node placement planning and/or can be pre-defined (e.g., such as a pre-defined list that is input).

The processing resources 570-1, 570-2 . . . 570-N coupled to the memory resource 572 can calibrate the map with coordinates. The calibration can include real world dimensions added to the map. Further, the processing resources 570-1, 570-2 . . . 570-N coupled to the memory resource 572 can place each node of a number of nodes of a node network on the calibrated map of the area utilizing the node placement model.

The processing resources 570-1, 570-2 . . . 570-N coupled to the memory resource 572 can verify the placement of each of the number of nodes of the node network complies with the number of structural rules including: identify a placement of a node among the number of nodes that deviates from a structural rule among the number of structural rules, provide an indication of the node on the map, and revise the placement of the node on the map in response to an input from a user.

In various embodiments of the present disclosure, the processing resources 570-1, 570-2 . . . 570-N coupled to the memory resource 572 can verify the revised placement of the node complies with the number of structural rules utilizing the node placement model. In some embodiments, the verification can include identifying the placement of each of the number of nodes, including the revised placement of the node, complies with the number of structural rules and/or provides sufficient coverage of the area.

In accordance with some embodiments of the present disclosure, the processing resources 570-1, 570-2 . . . 570-N coupled to the memory resource 572 can save the placement of each of the number of nodes in response to identifying the placement of each of the number of nodes, including the revised placement of the node, complies with the number of structural rules. Further, the processing resources 570-1, 570-2 . . . 570-N coupled to the memory resource 572 can generate a report of the placement of each of the number of nodes, including the revised placement of the node.

In various embodiments of the present disclosure, the system can include one or more input devices. A user may enter commands and information into the system through the input devices. Example input devices can include a keyboard, mouse and/or other point device, touch screen, microphone, joystick, game pad, scanner, etc. The input devices can be connected to the system through an interface, such as a parallel port, game port, or a universal serial bus (USB). A monitor or other type of display device can also be connected to the system via an interface, such as a video adapter. The monitor can display graphical user information for the user.

Any of the above information, data, and/or images can be saved along with the plurality of images as metadata and/or a data file which can be available for later image processing and/or other purposes.

As used herein, "logic" is an alternative or additional processing resource to execute the actions and/or functions, etc., described herein, which includes hardware (e.g., various forms of transistor logic, application specific integrated circuits (ASICs), etc.), as opposed to computer executable instructions (e.g., software, firmware, etc.) stored in memory and executable by a processor.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A method for node placement planning, comprising:
   determining a placement for each node of a number of nodes of a node network on a map of an area according to a network topology utilizing a node placement model to provide efficient and sufficient wireless coverage to the area;
   identifying a number of structural rules based on structural information of the area from the map displaying at least one structural element of the area, wherein the at least one structural element includes at least one of an object or material and has a structural element classification based on an associated type of structural element, and wherein the structural information includes identification of the type of the at least one structural element and location of the at least one structural element on the map of the area;
   providing the number of structural rules into the node placement model, wherein the number of structural rules includes at least one of an identification of particular classifications of nodes that cannot be physically placed on particular classifications of structural elements and an identification of particular classifications of nodes that can be placed on particular classifications of structural elements;
   identifying a placement of a node among the number of nodes that deviates from a structural rule among the number of structural rules, wherein the placement of the node overlaps with a particular classification of structural element such that the particular classification of the node cannot be physically placed on for installation the particular classification of structural element;
   providing an indication of the node that deviates from the structural rule on the map of the area notifying a user to revise the placement of the node in response to a determination that a potential installation problem exists resulting from the node deviating from the structural rule; and
   installing the number of nodes based on the map of the area with nodes placed thereon and the revised placement of the node deviating from the structural rule.

2. The method of claim 1, wherein providing the indication includes providing a visual indication on the map.

3. The method of claim 1, including identifying a sub-set of the number of nodes that deviate from at least one of the structural rules.

4. The method of claim 1, including providing a different indication of a node among the number of nodes that is overlapping with a structural element of the area and complies with the number of structural rules.

5. The method of claim 1, wherein identifying the number of structural rules includes identifying a sub-set of nodes that can be physically placed on a number of structural elements of the area.

6. The method of claim 1, wherein identifying the number of structural rules includes identifying a sub-set of nodes that cannot be physically placed on a number of structural elements of the area.

7. The method of claim 6, wherein:
   identifying the placement of the node deviates from the structural rule includes identifying the node is overlapping with a structural element among the number structural elements that the node cannot be physically placed on; and
   wherein the node is among the sub-set of nodes.

8. A non-transitory computer-readable medium storing instructions executable by a processing resource to:
   receive a map displaying at least one structural element of an area;
   place a number of nodes of a node network on the map of an area according to a network topology utilizing a node placement model to provide efficient and sufficient coverage to the area;
   identify structural information of the area from the map displaying the at least one structural element of the area, wherein the at least one structural element includes at least one of an object or material and has a structural element classification based on an associated type of structural element, and wherein the structural information includes identification of the type of the at least one structural element and location of the at least one structural element on the map of the area;
   provide a number of structural rules based on the structural information of the area into the node placement model utilizing the structural information, wherein the number of structural rules includes at least one of an identification of particular classifications of nodes that cannot be physically placed on particular classifications of structural elements and an identification of particular classifications of nodes that can be placed on particular classifications of structural elements;
   identify a placement of a node among the number of nodes that deviates from a structural rule among the number of structural rules utilizing the node placement model, wherein the placement of the node overlaps with a particular classification of structural element such that the particular classification of the node cannot be physically placed on for installation the particular classification of structural element;
   provide an indication of the identified node that deviates from the structural rule on the map notifying a user to revise the placement of the node in response to a determination that a potential installation problem exists resulting from the node deviating from the structural rule; and
   install the number of nodes based on the map of the area with nodes placed thereon and the revised placement of the node deviating from the structural rule.

9. The medium of claim 8, wherein the map includes an object readable file and the instructions to identify the structural information include instructions executable by the processing resource to identify the structural information utilizing the map.

10. The medium of claim 8, wherein the instructions include instructions executable by the processing resource to calibrate the map with real world dimensions.

11. The medium of claim 8, wherein the map comprises a raster format and the instructions to identify the structural information include instructions executable by the processing resource to utilize an automatic tagging model to identify structural elements in the map based on pattern matching.

12. The medium of claim 11, wherein the instructions to identify the structural information include instructions executable by the processing resource to classify the identified structural elements into various known classes based on a prior set of collect data.

13. The medium of claim 8, wherein the node placement model includes at least one of a Minimum Node Connected Coverage (MNCC) algorithm and a Robust Connected Coverage (RCC) algorithm.

14. A system for node placement planning comprising a processor in communication with a non-transitory computer readable medium, wherein the non-transitory computer readable medium includes a set of instructions executed by the processor to:
   calibrate an imported map of an area with coordinates;
   place a number of nodes of a node network on the calibrated map of the area according to a network topology utilizing a node placement model to provide efficient and sufficient coverage to the area;
   identify structural information of the area from the imported map displaying the at least one structural element information of the area, wherein the at least one structural element includes at least one of an object or material and has a structural element classification based on an associated type of structural element, and wherein the structural information includes identification of the type of the at least one structural element and location of the at least one structural element on the map of the area;
   provide a number of structural rules of the area in the node placement model utilizing the identified structural information, wherein the number of structural rules includes at least one of an identification of particular classifications of nodes that cannot be physically placed on particular classifications of structural elements and an identification of particular classifications of nodes that can be placed on particular classifications of structural elements;
   place each node of a number of nodes of a node network on the calibrated map of the area utilizing the node placement model; and
   verify the placement of each of the number of nodes of the node network complies with the number of structural rules including:
   identify a placement of a node among the number of nodes that deviates from a structural rule among the number of structural rules, wherein the placement of the node overlaps with a particular classification of structural element such that the particular classification of the node cannot be physically placed on for installation the particular classification of structural element;
   provide an indication of the node that deviates from the structural rule on the map notifying a user to revise the placement of the node in response to a determination that a potential installation problem exists resulting from the node deviating from the structural rule;
   revise the placement of the node on the map in response to an input from the user; and
   install the number of nodes based on the map of the area with nodes placed thereon and the revised placement of the node deviating from the structural rule provide an installation placement report for a user that indicates the placement of the number of nodes in the area based on compliance with the number of structural rules.

15. The system of claim 14, including instructions executed by the processor to verify the revised placement of the node complies with the number of structural rules utilizing the node placement model.

16. The system of claim 14, including instructions executed by the processor to save the placement of each of the number of nodes in response to identifying the placement of each of the number of a nodes, including the revised placement of the node, complies with the number of structural rules.

17. The system of claim 14, including instructions executed by the processor to generate a report of the placement of each of the number of nodes, including the revised placement of the node.

18. The system of claim 14, wherein the indication includes a first visual color indication.

19. The system of claim 14, including instructions executed by the processor to provide a second visual color indication of a node on the map, wherein the node is located on a structural element of the area and complies with the number of structural rules.

20. The system of claim 14, wherein:
   the map includes a three-dimensional (3D) map; and
   the instructions executed by the processor to verify the placement of the number of nodes complies with the number of structural rules include instructions executed to:
      utilize z-axis coordinates of the placement of the number of nodes and z-axis coordinates of a number of structural elements from the identified structural information to verify compliance with the number of structural rules.

* * * * *